US 6,926,489 B2

(12) United States Patent
Lee et al.

(10) Patent No.: US 6,926,489 B2
(45) Date of Patent: Aug. 9, 2005

(54) LATCH SENSOR FOR POD TRANSPORT GRIPPER

(75) Inventors: Yan-Ping Lee, Kaohsiung (TW);
Kuo-Hsing Teng, Hsin Chu (TW);
Chi-Chung Chang, Kaohsiung (TW);
Fu-Shun Lo, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 138 days.

(21) Appl. No.: 10/143,084

(22) Filed: May 9, 2002

(65) Prior Publication Data

US 2003/0210971 A1 Nov. 13, 2003

(51) Int. Cl.[7] ............................................... B65G 1/133
(52) U.S. Cl. .................. 414/217; 414/217; 414/222.02; 414/222.07; 414/222.13; 414/225.01; 414/935; 414/940; 901/33; 901/47; 294/81.53
(58) Field of Search ..................... 414/217.1, 222.02, 414/222.07, 222.13, 225.01, 226.04, 460, 461, 751.1, 806, 935, 940, 217; 294/81.53, 907; 901/33, 47

(56) References Cited

U.S. PATENT DOCUMENTS

| | | | | |
|---|---|---|---|---|
| 5,110,248 A | * | 5/1992 | Asano et al. | 414/172 |
| 5,803,696 A | * | 9/1998 | Tsai et al. | 414/416.01 |
| 6,419,438 B1 | * | 7/2002 | Rosenquist | 414/217 |
| 6,468,021 B1 | * | 10/2002 | Bonora et al. | 414/522 |
| 6,641,350 B2 | * | 11/2003 | Nakashima et al. | 414/217 |

* cited by examiner

Primary Examiner—Khoi H. Tran
Assistant Examiner—Michael Lowe
(74) Attorney, Agent, or Firm—Tung & Associates

(57) ABSTRACT

A latch sensor for a pod transport gripper for transferring semiconductor wafers is disclosed. The transport gripper has a left bar and a right bar, as well as a cross bar connecting the left and the right bars. The gripper also has a left clamp and a right clamp disposed on interior sides of the left bar and the right bar, respectively, to clamp a pod, such as a front-opening unified pod (FOUP), for transport. A number of latches are disposed on the cross bar, and correspond to a number of latch holes of the pod. The gripper has at least one latch sensor disposed on either the left bar, the right bar, or both, to determine whether the latches have properly engaged the latch holes of the pod.

15 Claims, 3 Drawing Sheets

LATCH SENSOR FOR POD TRANSPORT GRIPPER

FIELD OF THE INVENTION

This invention relates generally to pods, such as front-opening unified pods (FOUP's) for transferring semiconductor wafers, and more particularly to transfer systems for such pods and their transport grippers.

BACKGROUND OF THE INVENTION

The fabrication of semiconductor devices on semiconductor wafers requires that the semiconductor wafers be processed in a variety of different manners. Photolithography, chemical mechanical polishing (CMP), metal deposition, and so on, are all processes performed on semiconductor wafers in precise degrees to fabricate semiconductor devices. Usually, each of these different processes is performed using a different piece of semiconductor fabrication equipment. Therefore, a transport system is used to transport the semiconductor wafers among the different pieces of semiconductor fabrication equipment to achieve semiconductor device fabrication. Usually the semiconductor wafers are transported in pods, such as front-opening unified pods (FOUP's).

FIG. 1 shows a top view of a traditional pod transport system 100. The system 100 particularly includes a conveyor belt 104 on which the pods may be transported among various stations 102a, 102b, . . . , 102n. Each of these stations 102a, 102b, . . . , 102n may be a separate piece of semiconductor fabrication equipment, a storage place to store pods and their semiconductor wafers, and so on. Overhead transfer (OHT) units 106 are able to move the pods vertically. The OHT units 106 are also referred to as OHT grippers, in that they grip the pods.

One particular area 108 of the system 100 of FIG. 1 is shown in more detail in a side view in FIG. 2. One of the OHT units 106 has a pod 202a that it is vertically lowering onto one of the load ports 204. One of the robot arms 208 has lowered on its vertical axis 206 to pick up the pod 202b that has already been lowered onto one of the load ports 204. The other of the robot arms 208 has risen on its vertical axis 206 to deposit the pod 202c onto one of the conveyor belts 104. In this way, pods 202 are moved from the OHT units 106 to the load ports 204, and ultimately to the conveyor belts 104. Furthermore, the OHT units 106 can vertically raise the pods 202 from the load ports 204.

A difficulty with the system 100 is the manner by which the OHT units 106 engage the pods 202 from the load ports 204 for vertically raising them. In particular, the OHT units 106 typically have latches that rotatably engage into corresponding latch holes of the pods 202. However, if the latches of the OHT units 106 do not smoothly slide into the latch holes of the pods 202, the latches may jam in the latch holes of the pods 202. Removing the pods 202 from the OHT units 106 can in this case be accomplished only manually, by forcing the pods 202 from the OHT units 106. Besides the downtime that results from this problem, it can also damage the pods 202, and particularly their latch holes. The pods 202 may then have to be repaired or replaced.

Therefore, there is a need to overcome these disadvantages. There is a need to ensure that the latches of OHT units are smoothly slid into the corresponding latch holes of pods. There is also a need to ensure that damage does not result to the pods when the latches of the OHT units do not smoothly slide into the corresponding latch holes of pods. For these and other reasons, therefore, there is a need for the present invention.

SUMMARY OF THE INVENTION

The invention relates to a latch sensor for a pod transport gripper for transferring semiconductor wafers. The transport gripper has a left bar and a right bar, as well as a cross bar connecting the left and the right bars. The gripper also has a left clamp and a right clamp disposed on interior sides of the left bar and the right bar, respectively, to clamp a pod, such as a front-opening unified pod (FOUP), for transport. A number of latches are disposed on the cross bar, and correspond to a number of latch holes of the pod. The gripper has at least one latch sensor disposed on either the left bar, the right bar, or both, to determine whether the latches have properly engaged the latch holes of the pod.

Embodiments of the invention provide for advantages over the prior art. When the transport gripper descends to a specific position, it starts gripping a pod from the load port on which the pod currently sits. As soon as the transport gripper begins to ascend vertically, the clamps on the sides of the gripper stretch out to clamp the pod, and the latches will become inserted into the corresponding latch holes of the pod during a docking process. During the docking process, the latch sensors detect whether the latches can slide into the latch holes smoothly. If so, then the latches rotatably engage the latch holes of the pod, and the pod continues on within the transport system. If not, the pod is transported elsewhere for inspection. Thus, the latch sensors of the invention ensure that the pod is not damaged, and that downtime does not occur in unfastening a jammed pod from a transport gripper.

Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
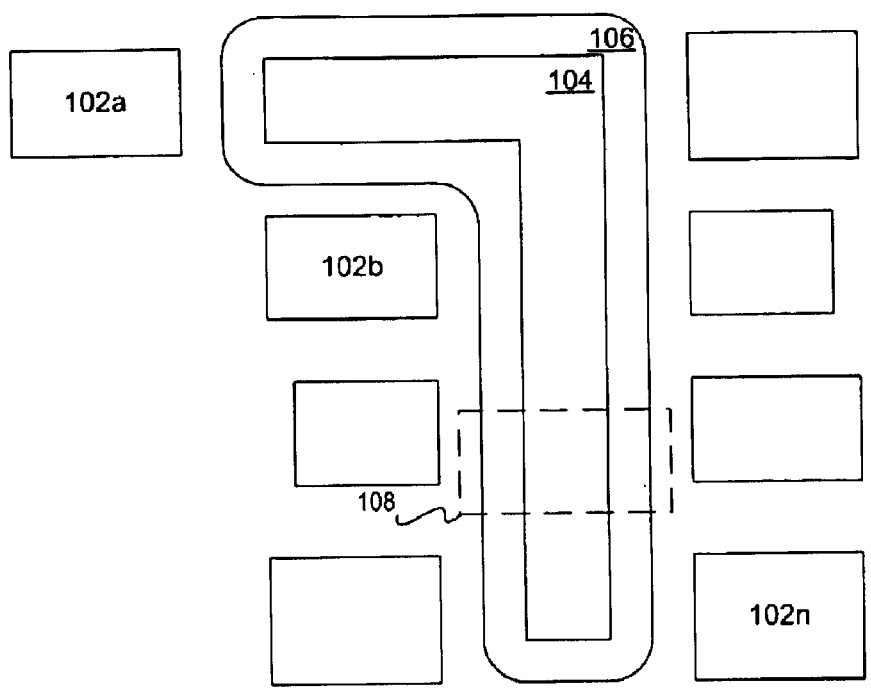
FIG. 1 is a diagram of a top view of a pod transfer system according to the prior art. The pod transfer system includes conveyors and overhead transfer (OHT) units for moving pods of semiconductor wafers to different semiconductor fabrication equipment.
Figure 2:
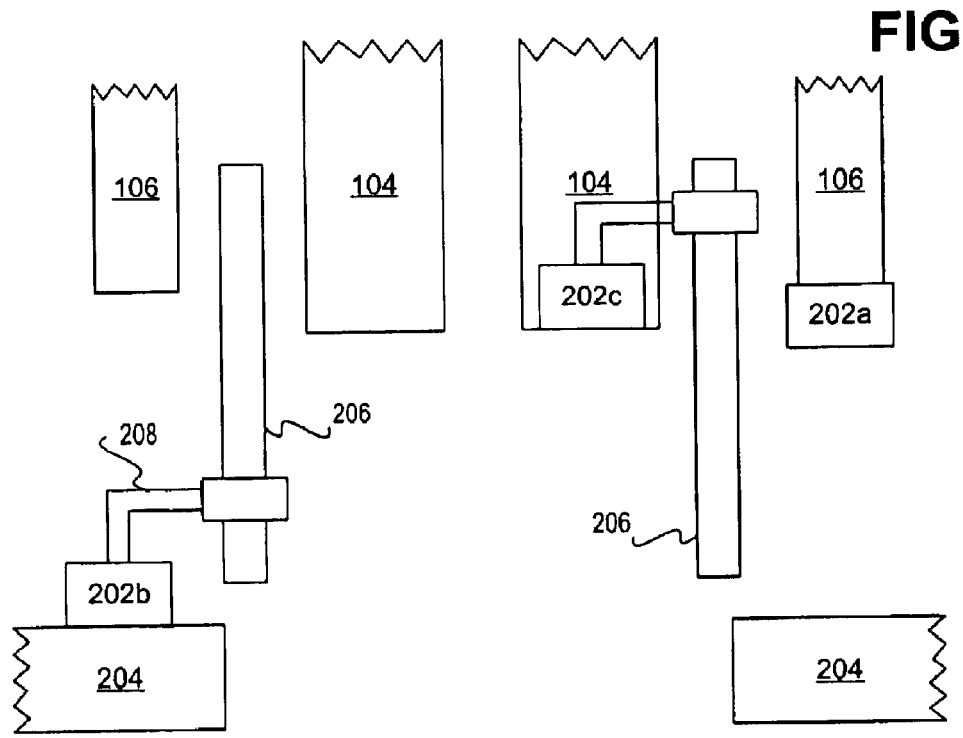
FIG. 2 is a diagram of a side view of the pod transfer system of FIG. 1, in which the OHT units transport pods vertically to and from load ports, where the OHT units have latches that may jam improperly in latch holes of the pods.
Figure 3:
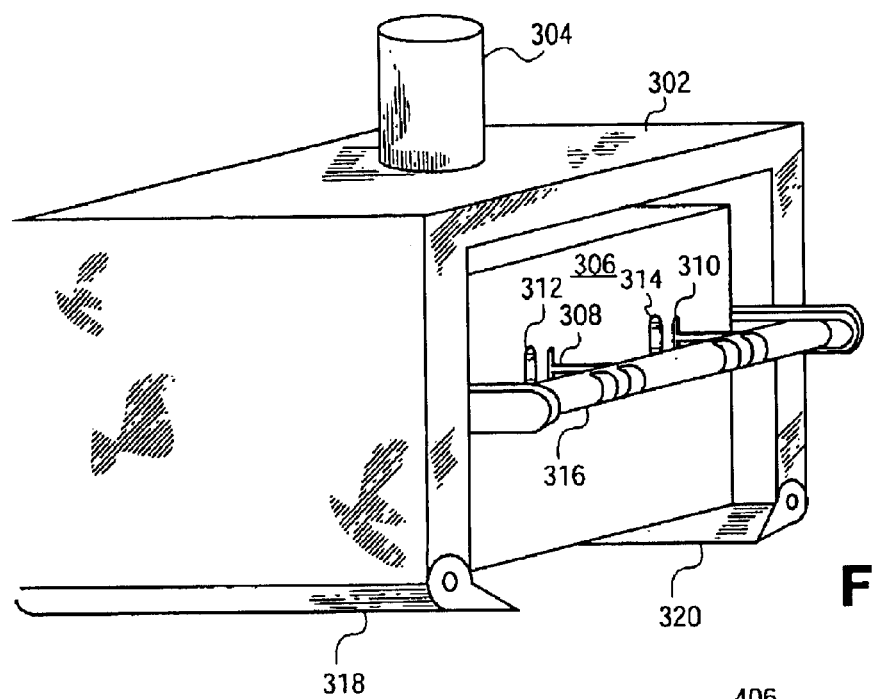
FIG. 3 is a diagram of an example front-opening unified pod (FOUP) inserted into an OHT gripper, in accordance with which embodiments of the invention may be practiced.

FIG. 3 shows a front-opening unified pod (FOUP) 306 inserted into an overhead transport (OHT) gripper 302, according to an embodiment of the invention. The OHT gripper 302 is one type of transport gripper, and the invention is applicable to other types of transport grippers as well. Similarly, the FOUP 306 is one type of pod, and the invention is applicable to other types of pods as well. Preferably, the FOUP 306 is for transferring semiconductor wafers. The OHT gripper 302 can be the OHT units 106 described in conjunction with FIG. 2, whereas the FOUP 306 can be the pods 202 described in conjunction with FIG. 2. The OHT gripper 302 is raised and lowered via a rod 304, a portion of which is shown in FIG. 3.

The gripper 302 has bars 316 from which latches 308 and 310 extend. The latches 308 and 310 fit into corresponding latch holes 312 and 314 of the FOUP 306. The gripper 302 engages the FOUP 306 as follows. First, the gripper 302 lowers onto the FOUP 306, with the bottom doors 318 and 320 being in a vertical position. As the gripper 302 rises, the doors 318 and 320 move to their horizontal position, underneath the FOUP 306 to support the FOUP 306, as specifically indicated in FIG. 3, so that the FOUP 306 can be lifted. The latches 308 and 310 slide into the holes 312 and 314. Assuming a good fit, the latches 308 and 310 then rotate within the holes 312 and 314, to rotatably engage the holes 312 and 314.

Figure 4:
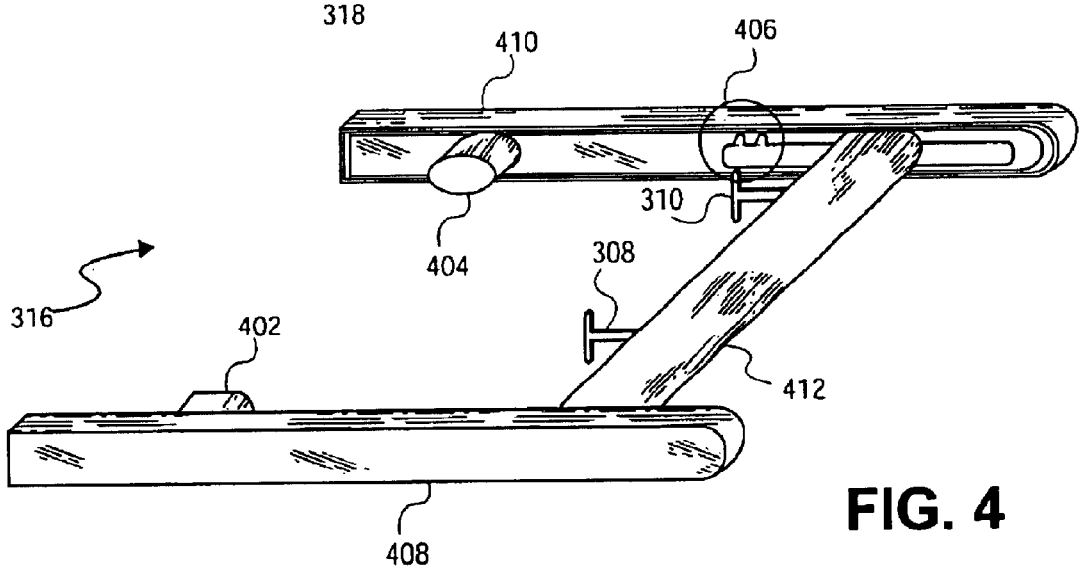
FIG. 4 is a diagram of the left bar, the right bar, and the cross bar of an OHT gripper in detail, according to an embodiment of the invention, where the left bar and the right bar each have a latch sensor disposed thereon.

FIG. 4 shows the bars 316 of the gripper 302 in more detail. There is a left bar 408 and a right bar 410. The left bar 408 and the right bar 410 are connected to one another via a cross bar 412. The cross bar 412 specifically has a length substantially equal to the width of the FOUP 306. The latches 308 and 310 specifically are disposed on the interior of the cross bar 412. Disposed on the interior of the left bar 408 and the right bar 408 are clamps 402 and 404, respectively. When the gripper 302 slides over the FOUP 306, the clamps 402 and 404 clamp onto and frictionally engage the FOUP 306, to further support the FOUP 306 within the gripper 302. The FOUP 306 may be located on a load port, such as the load ports 204 of FIG. 2, from which the gripper 302 retrieves the FOUP 306 for vertical movement or transport. Furthermore, the left bar 408 and the right bar 410 may have one or more screws on their interior sides, not shown in FIG. 4, that assist the mounting of the latches 308 and 310 within the latch boles 312 and 314 of the FOUP 306.

If the latches 308 and 310 of the gripper 302 are not aligned within the holes 312 and 314 of the FOUP 306, the latches 308 and 310 may jam inside the holes 312 and 314, especially when they rotate within the holes 312 and 314. To prevent this from occurring, latch sensors are preferably located on the interior sides of the left bar 408 and the right bar 410. FIG. 4 specifically shows one such sensor 406. The sensor 406 may be an optical sensor, an electrical sensor, an electromechanical sensor, or another type of sensor.

The sensor 406 determines whether the latches 308 and 310 are properly engaging within the holes 312 and 314. For instance, the sensor 406 may use optics, such as an infrared beam, to determine whether the latches 308 and 310 are properly engaging within the holes 312 and 314. If the latches 308 and 310 are not properly engaging within the holes 312 and 314, then the sensor 406 signals the controlling mechanism responsible for rotating the latches 308 and 310. In response, the controlling mechanism does not rotate the latches 308 and 310, so that they do not jam within the holes 312 and 314.

Figure 5:
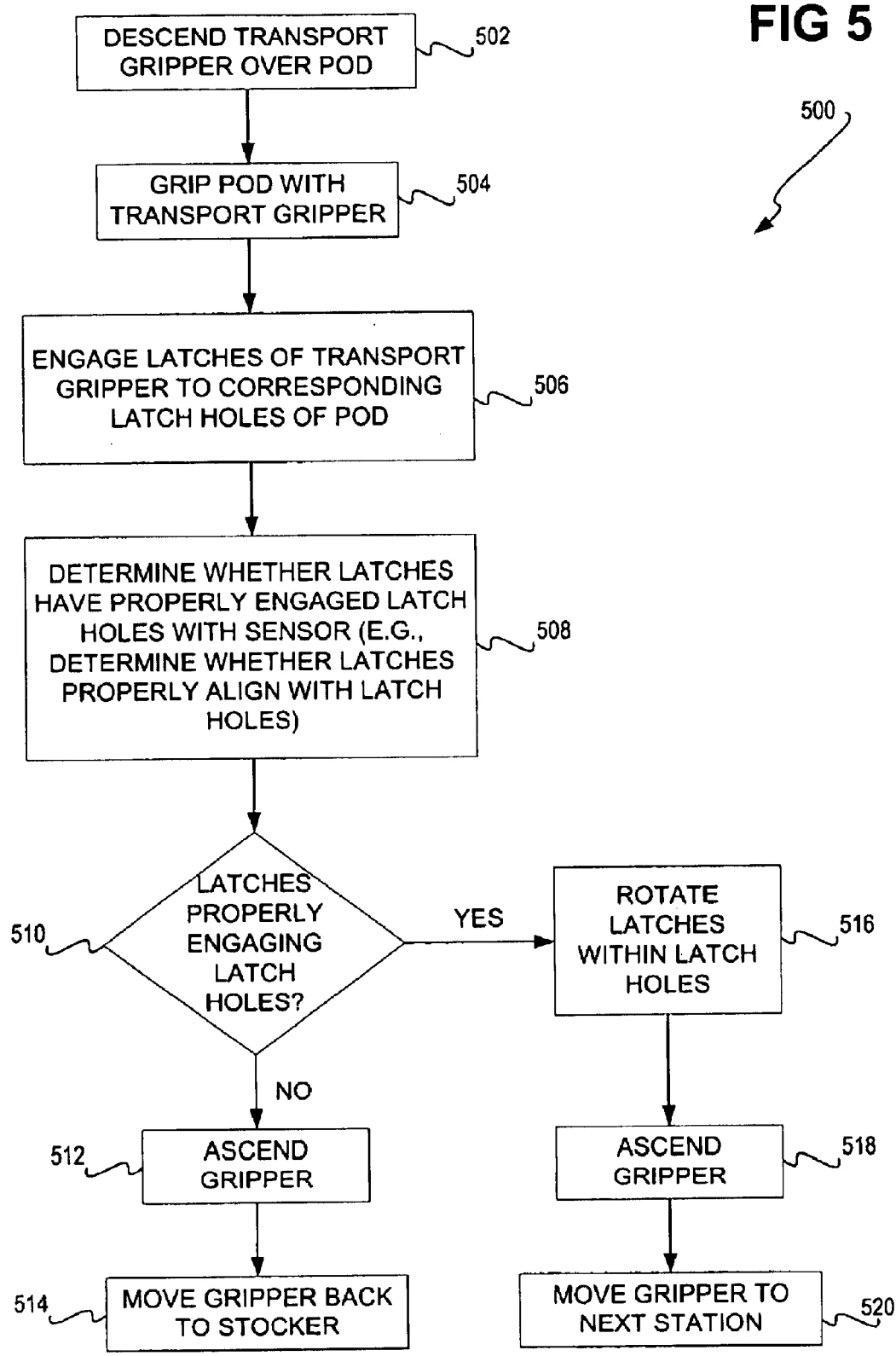
FIG. 5 is a method depicting an example process followed by an OHT gripper and an FOUP, according to an embodiment of the invention, where the gripper has one or more latch sensors to ensure proper engagement with the FOUP.

FIG. 5 shows a method 500 that can be performed in accordance with the embodiments of the invention described in conjunction with FIGS. 3 and 4, according to an embodiment of the invention. The method 500 is an example of one type of method that can use the OHT gripper 302 and the FOUP 306 described in conjunction with FIGS. 3 and 4. However, the OHT gripper 302 and the FOUP 306 are also amenable to other methods as well.

First, the OHT gripper 302 descends over the FOUP 306 (502). The FOUP 306 may be situated on a load port, from which the OHT gripper 302 is to grip the FOUP 306. Next, the FOUP 306 is gripped by the OHT gripper 302 (504). For instance, clamps 402 and 404 on the OHT gripper 302 may clamp onto the FOUP 306. The latches 308 and 310 of the OHT gripper 302 engage the corresponding latch holes 312 and 314 of the FOUP 306 (506). For instance, the latches 308 and 310 can extend to slide into the latch holes 312 and 314. This may be accomplished by manually or mechanically turning a screw on the OHT gripper 302 that controls the latches 308 and 310, although the invention is not so limited.

Next, latch sensors of the OHT gripper 302 determine whether the latches 308 and 310 have properly engaged the latch holes 312 and 314 (508). This determination may actually be accomplished prior to and/or as the latches 308 and 310 are sliding into the latch holes 312 and 314, to determine whether the latches 308 and 310 are properly aligned with the latch holes 312 and 314. The result of this determination is that either the latches 308 and 310 are properly or are not properly engaging the latch holes 312 and 314 (510).

If the latches 308 and 310 are not properly engaging the latch holes 312 and 314, then the gripper ascends (512), and moves back to a stocker (514). In the stocker, a technician can then examine the gripper 302 to determine why the latches 308 and 310 are not properly engaging the latch holes 312 and 314. Importantly, however, the determination in 508 prevents damage resulting to the gripper 302 or the FOUP 306, in contradistinction to the prior art.

Conversely, if the latches 308 and 310 of the gripper 302 are properly engaging the latch holes 312 and 314 of the FOUP 306, then the latches 308 and 310 are rotated within the latch holes 312 and 314 (516). Because proper engagement was determined, the latches 308 and 310 do not jam within the latch holes 312 and 314 upon rotation, avoiding damage to the gripper 302 or the FOUP 306. The gripper 302 then ascends (518), and a next semiconductor processing station within a semiconductor transport system can be proceeded to with the gripper as appropriate (520).

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A transport gripper for a pod for transferring semiconductor wafers comprising:

a left bar and a right bar;

a cross bar connecting the left bar and the right bar;

a left clamp and a right clamp disposed on interior sides of the left bar and the right bar to clamp the pod for transport;

a plurality of latches disposed on the cross bar and corresponding to a plurality of latch holes of the pod; and, at least one latch sensor disposed on at least one of the left bar and the right bar to determine whether the plurality of latches have properly engaged the plurality of latch holes of the pod.

2. The transport gripper of claim 1, wherein the transport gripper is an overhead-transport (OHT) gripper.

3. The transport gripper of claim 1, wherein the pod is a front-opening unified pod (FOUP).

4. The transport gripper of claim 1, wherein the cross bar has a length substantially equal to a width of the pod.

5. The transport gripper of claim 1, wherein the left clamp and the right clamp clamp the pod for vertical transport.

6. The transport gripper of claim 1, wherein the plurality of latches comprises a pair of latches corresponding to a pair of latch holes of the pod.

7. The transport gripper of claim 1, wherein the plurality of latches rotatably engage the plurality of latch holes of the pod.

8. The transport gripper of claim 1, wherein the at least one latch sensor comprises a left sensor situated on the interior side of the left bar and a right sensor situated on the interior side of the right bar.

9. A system comprising a pod having a plurality of latch holes and two side surfaces and receptive to semiconductor wafers;

a transport gripper for vertically transferring the pod via two clamps clamping to the two side surface of the pod and a plurality of latches rotatably engaging the plurality of latch holes; and, at least one latch sensor disposed on the transport gripper to determine whether the plurality of latches have properly engaged the plurality of latch holes of the pod; wherein the transport gripper comprises a left bar, a right bar, and a cross bar connecting the left bar and the right bar, the two clamps disposed on interior side of the left bar and the right bar, the plurality of latches disposed on the cross bar, and the at least one latch sensor disposed on at least one of the left bar and the right bar.

10. The system of claim 9, wherein the cross bar has a length substantially equal to a width of the pod.

11. The system of claim 9, wherein the at least one latch sensor comprises a left sensor situated on the interior side of the left bar and a right sensor situated on the interior side of the right bar.

12. The system of claim 9, wherein the transport gripper comprises an overhead-transport (OHT) gripper.

13. The system of claim 9, wherein the pod comprises a front-opening unified pod (FOUP).

14. The system of claim 9, wherein the plurality of latch holes comprises a pair of latch holes and the plurality of latches comprises a pair of latches.

15. The system of claim 9, wherein the at least one latch sensor comprises a pair of latch sensors.

* * * * *